United States Patent
Chen (10) Patent No.: US 10,244,589 B2
(45) Date of Patent: Mar. 26, 2019

(54) MICRO LED DISPLAY PANEL

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 283 days.

(21) Appl. No.: 15/116,214

(22) PCT Filed: Jul. 15, 2016

(86) PCT No.: PCT/CN2016/090109
§ 371 (c)(1),
(2) Date: Aug. 3, 2016

(87) PCT Pub. No.: WO2017/219413
PCT Pub. Date: Dec. 28, 2017

(65) Prior Publication Data
US 2018/0206298 A1    Jul. 19, 2018

(30) Foreign Application Priority Data
Jun. 20, 2016 (CN) .......................... 2016 1 0448852

(51) Int. Cl.
*H05B 33/02* (2006.01)
*H01L 51/52* (2006.01)
(Continued)

(52) U.S. Cl.
CPC ............ *H05B 33/02* (2013.01); *G09G 3/32* (2013.01); *H01L 27/32* (2013.01); *H01L 33/52* (2013.01); *H01L 51/5275* (2013.01)

(58) Field of Classification Search
CPC . H01L 25/0753; H01L 25/167; H01L 27/156; H01L 33/62; H01L 33/60; H01L 2924/12041; H01L 2924/12042; H01L 2924/12044; H01L 33/52; H01L 27/322; G02F 1/133603; G09G 3/32; H05B 33/02; G09F 9/33
See application file for complete search history.

(56) References Cited

U.S. PATENT DOCUMENTS

| | | | | |
|---|---|---|---|---|
| 9,443,904 B1* | 9/2016 | Chen | ..................... | H01L 25/075 |
| 2003/0077847 A1* | 4/2003 | Yoo | ......................... | H01L 33/46 438/22 |

(Continued)

FOREIGN PATENT DOCUMENTS

| | | |
|---|---|---|
| CN | 101740670 A | 6/2010 |
| CN | 105144387 A | 12/2015 |
| CN | 105339996 A | 2/2016 |

*Primary Examiner* — Hong Zhou
(74) *Attorney, Agent, or Firm* — Leong C. Lei (57) ABSTRACT

The invention provides a micro LED display panel, with sub-pixel area (2) disposed with a micro LED (3) of a size smaller than the size of the sub-pixel area (2), and using a reflective lens layer (5) disposed below the micro LED (3) to reflect the light emitted by micro LED (3) to the area surrounding the micro LED (3) inside the sub-pixel area (2), and thereby expanding the illuminating area inside the sub-pixel area (2) to enhance the display quality and reduce cost.

17 Claims, 6 Drawing Sheets

(51) Int. Cl.
*H01L 27/32* (2006.01)
*H01L 33/52* (2010.01)
*G09G 3/32* (2016.01)

(56) References Cited

U.S. PATENT DOCUMENTS

| | | | | |
|---|---|---|---|---|
| 2008/0123367 A1* | 5/2008 | Pan | ........................ | G02B 6/0025 362/628 |
| 2010/0109036 A1* | 5/2010 | Chen | ........................ | H01L 33/60 257/98 |
| 2013/0193592 A1* | 8/2013 | Peil | ........................... | F21K 9/00 257/791 |
| 2014/0367711 A1* | 12/2014 | Bibl | ........................ | H01L 24/24 257/89 |
| 2015/0029725 A1* | 1/2015 | Kamikawa | ............... | H01L 33/60 362/293 |

\* cited by examiner

MICRO LED DISPLAY PANEL

BACKGROUND OF THE INVENTION

1. Field of the Invention

The present invention relates to the field of display, and in particular to a micro light-emitting diode (micro LED) display panel.

2. The Related Arts

The panel display device, due to the advantages of high display quality, low power-consumption, thin size and wide application, is widely used in mobile phones, TV, PDA, digital camera, notebook PC, desktop PC, and so on, and becomes the mainstream technology.

The micro light-emitting diode (micro LED, μLED) display device is a display device which utilizes high density micro-scaled LED array integrated on a substrate as display pixels to achieve image display. Similar to a large-scaled outdoor LED display, each pixel is addressable and individually driven to emit light, and can be viewed as a reduce-sized outdoor LED display by reducing the inter-pixel distance from cm scale to mm scale. Micro LED display device and the organic light-emitting diode (OLED) are both self-luminous, but the micro LED shows the advantages of higher material stability, longer lifespan and no image imprinting as compared to the OLED, and is considered as the major competing technology for OLED display device.

The micro transfer printing (MTP) is the mainstream technology to manufacture micro LED display device. Specifically, first, the micro LED element is grown on the sapphire-based substrate; a laser lift-off (LLO) technology is used to separate the micro LED bare chip from the sapphire-based substrate, and then a patterned polydimethylsiloxane (PDMS) transfer stamp is used to adsorb to the micro LED bare chip off from the sapphire-based substrate; the PDMS transfer stamp is aligned with the receiving substrate for positioning; and then the micro LED bare chip adsorbed by the PDMS transfer stamp is attached to the pre-set position on the receiving substrate; and then the PDMS transfer stamp is peeled off to accomplish micro LED bare chip transfer to further manufacture the micro LED display device.

Figure 1:
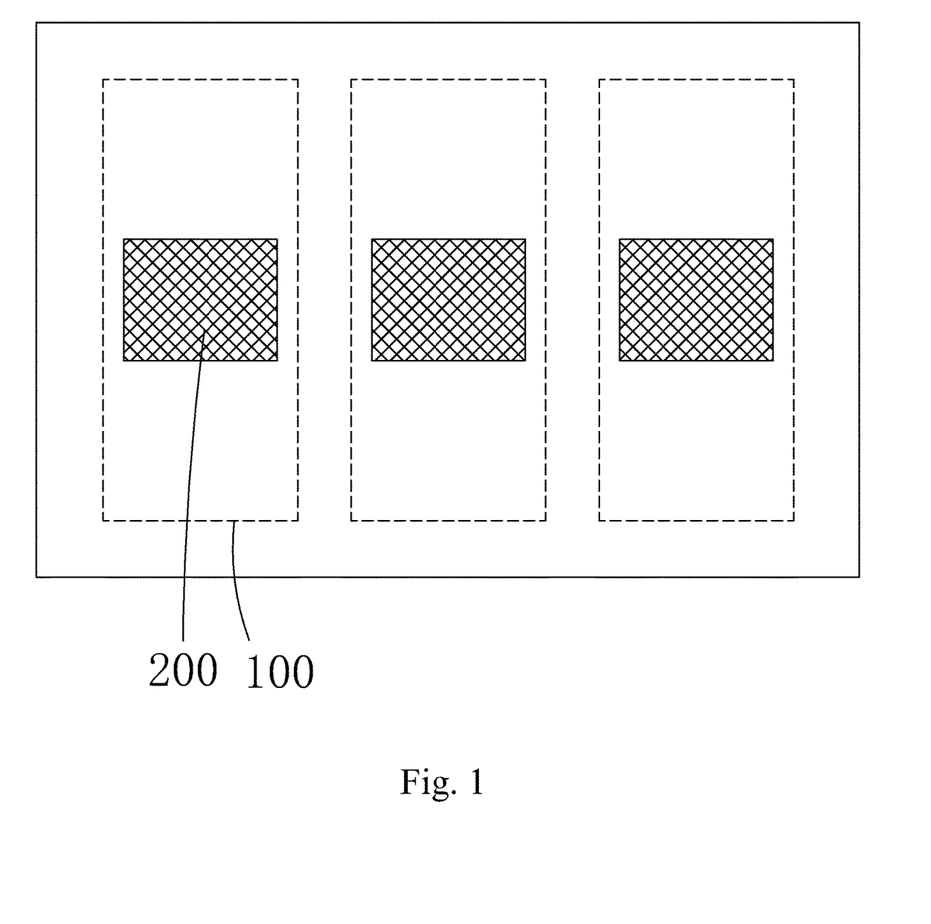
FIG. 1 is a schematic view showing the illuminating area of the sub-pixel of a known micro LED display panel.

The more the size of the micro LED, the cheaper the cost is and the smaller the light source is. However, refer to FIG. 1. The size of the sub-pixel 100 in the conventional flat display device is relatively large compared to the size of micro LED. If the micro LED with size comparable to the sub-pixel 100 is used as light source for each sub-pixel, the cost will be prohibitively high. On the other hand, if a micro LED with much smaller size than the sub-pixel 100 is used, the illuminating area 200 inside the sub-pixel 100 will be too small and leading to reduced display quality.

SUMMARY OF THE INVENTION

The object of the present invention is to provide a micro LED display panel, able to expand the illuminating area inside the sub-pixel without increasing the size of micro LED, so as to improve the display quality and reduce production cost.

To achieve the above object, the present invention provides a micro LED display panel, which comprises: a transparent substrate, and a plurality of sub-pixel areas disposed on an upper surface of the substrate and arranged in an array; a micro LED disposed in each sub-pixel area on the substrate, a transparent encapsulating layer disposed to cover the plurality of micro LEDs, and a reflective lens layer disposed on a lower surface of the substrate; each sub-pixel area being disposed with a micro LED, and the size of the micro LED being smaller than the size of the sub-pixel area; the reflective lens layer reflecting the light emitted by the micro LED to the area surrounding the micro LED inside the sub-pixel area to expand the illuminating area inside the sub-pixel area.

The reflective lens layer comprises a plurality of reflective lens unit, and the reflective lens units form a one-on-one correspondence with the micro LEDs.

The reflective lens unit has a shape of convex surface facing away from the substrate.

The encapsulating layer further comprises scattering particles, and the scattering particles scatter the light emitted from the micro LED and passing through the encapsulating layer.

The encapsulating layer is further disposed with a scattering lens layer, and the scattering lens layer scatter the light emitted from the micro LED and passing through the encapsulating layer and the scattering lens layer.

The scattering lens layer comprises a plurality of scattering lens units, and the scattering lens units form a one-on-one correspondence with the micro LEDs.

The scattering lens unit has a shape of convex surface facing away from the substrate.

The scattering lens unit has a serrated shape.

The plurality of micro LEDs comprises: red micro LEDs, green micro LEDs, and blue micro LEDs.

The encapsulating layer is made of parylene or organic resin.

The present invention also provides a micro LED display panel, which comprises: a transparent substrate, and a plurality of sub-pixel areas disposed on an upper surface of the substrate and arranged in an array; a micro LED disposed in each sub-pixel area on the substrate, a transparent encapsulating layer disposed to cover the plurality of micro LEDs, and a reflective lens layer disposed on a lower surface of the substrate; each sub-pixel area being disposed with a micro LED, and the size of the micro LED being smaller than the size of the sub-pixel area; the reflective lens layer reflecting the light emitted by the micro LED to the area surrounding the micro LED inside the sub-pixel area to expand the illuminating area inside the sub-pixel area; wherein the reflective lens layer comprising a plurality of reflective lens unit, and the reflective lens units forming a one-on-one correspondence with the micro LEDs; wherein the plurality of micro LEDs comprising: red micro LEDs, green micro LEDs, and blue micro LEDs; and wherein the encapsulating layer being made of parylene or organic resin.

Compared to the known techniques, the present invention provides the following advantages: the present invention provides a micro LED display panel, with sub-pixel area disposed with a micro LED of a size smaller than the size of the sub-pixel area, and using a reflective lens layer disposed below the micro LED to reflect the light emitted by micro LED to the area surrounding the micro LED inside the sub-pixel area, and thereby expanding the illuminating area inside the sub-pixel area to enhance the display quality and reduce cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 2:
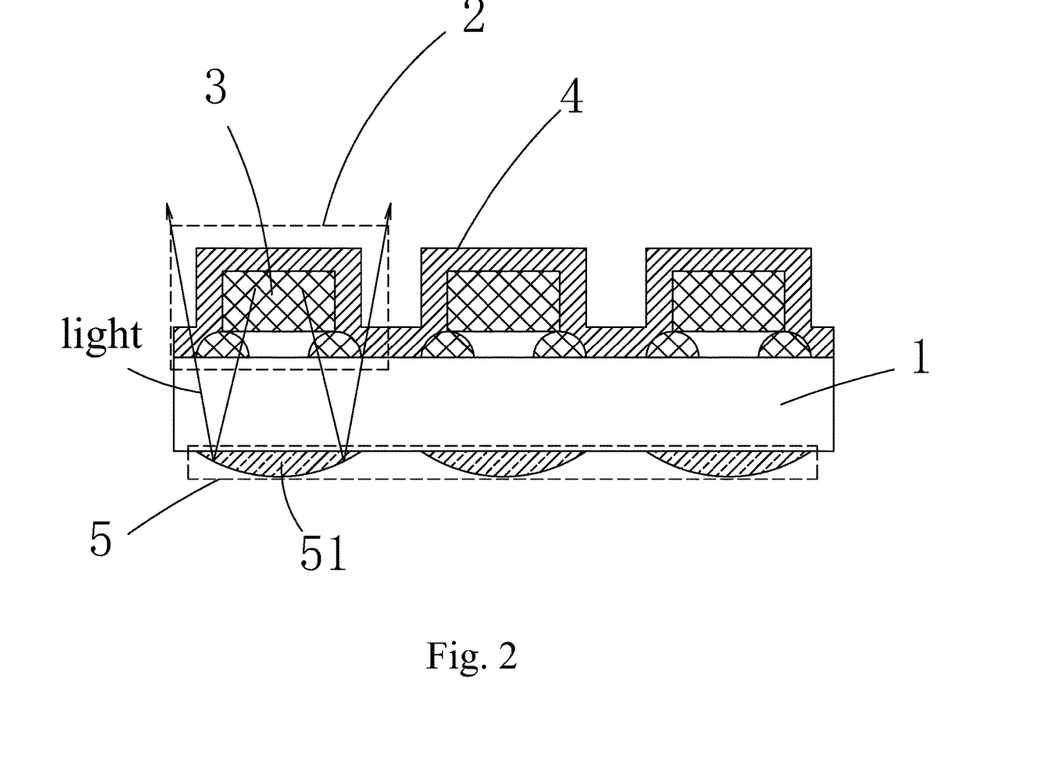
FIG. 2 is a schematic view showing the micro LED display panel provided by a first embodiment of the present invention.

Refer to FIG. 2. The present invention provides a micro LED display panel, as shown in FIG. 2, in the first embodiment, which comprises: a transparent substrate 1, and a plurality of sub-pixel areas 2 disposed on an upper surface of the substrate 1 and arranged in an array; a micro LED 3 disposed in each sub-pixel area 2 on the substrate 1, a transparent encapsulating layer 4 disposed to cover the plurality of micro LEDs 3, and a reflective lens layer 5 disposed on a lower surface of the substrate 1.

Each sub-pixel area 2 is disposed with a micro LED 3, and the size of the micro LED 3 is smaller than the size of the sub-pixel area 2.

The reflective lens layer 5 reflects the light emitted by the micro LED 3 to the area surrounding the micro LED 3 inside the sub-pixel area 2 to expand the illuminating area inside the sub-pixel area 2.

Specifically, the substrate 1 is preferably made of glass, and the substrate 1 is provided with driver circuit, connected to the micro LED 3 to control the illumination of the micro LED 3. The encapsulating layer is made of any type of parylene or organic resin. The plurality of micro LEDs 3 comprises: red micro LEDs, green micro LEDs, and blue micro LEDs.

It should be noted that the reflective lens layer 5 comprises a plurality of reflective lens unit 51, and the reflective lens units 51 form a one-on-one correspondence with the micro LEDs 3. In other words, the reflective lens unit 51 is disposed below each micro LED 3 to reflect the light emitted by the micro LED 3 passing through the substrate 1 to arrive at the reflective lens unit 51. The reflective lens unit 51 reflects the light to the area inside the sub-pixel area 2 surrounding the micro LED 3 so that the area other than the micro LED 3 inside the sub-pixel area 2 is also illuminated by the reflected light from the reflective lens unit 51. As such the illuminating area inside the sub-pixel area 2 is expanded.

Preferably, the reflective lens unit 51 has a shape of convex surface facing away from the substrate 1.

It should be noted that the light intensity of the illuminating area inside the sub-pixel area after reflection from the reflective lens layer 5 is greater than the half of the total light intensity emitted by the micro LED 3. Provided that the original illuminating area of the micro LED 3 is a square-microns, and the illuminating area needed to reach inside the sub-pixel area 2 after reflection from the reflective lens layer 5 is b square-microns (b>a). At this time, the original illuminating area of the micro LED 3, after the reflection from the reflective lens layer 5, is expanded to the illuminating area of b square-micron. The distance from the b square-micron illuminating area to the micro LED 3 is L, and L is greater than or equal to $b/a \times 10^{-5}$ m, and less than or equal to $b/a \times 10^{-2}$ m. In other words, when the original illuminating area of the micro LED 3 is expanded by the reflection from the reflective lens layer 5 to the illuminating area needed to reach, the distance from the micro LED 3 must be restricted to a reasonable range.

Figure 6:
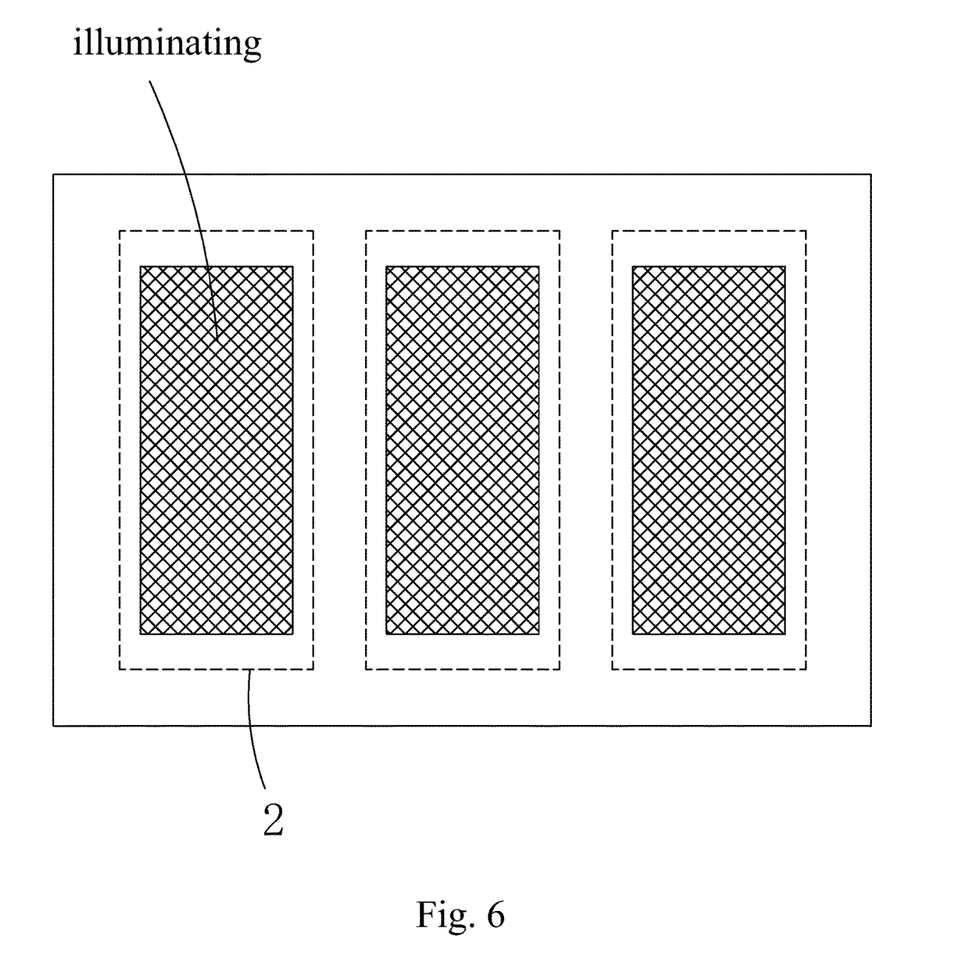
FIG. 6 is a schematic view showing the illuminating area of the micro LED display panel provided by an embodiment of the present invention.

Moreover, refer to FIG. 6. FIG. 6 is a schematic view showing the illuminating area of the micro LED display panel provided by an embodiment of the present invention. By comparing FIG. 1 and FIG. 6, it is obvious that the illuminating area in the sub-pixel area 2 is prominent increased after the reflection from the reflective lens layer 5 without changing the size of micro LED 3, and thus improves the display quality of micro LED display panel.

Figure 3:
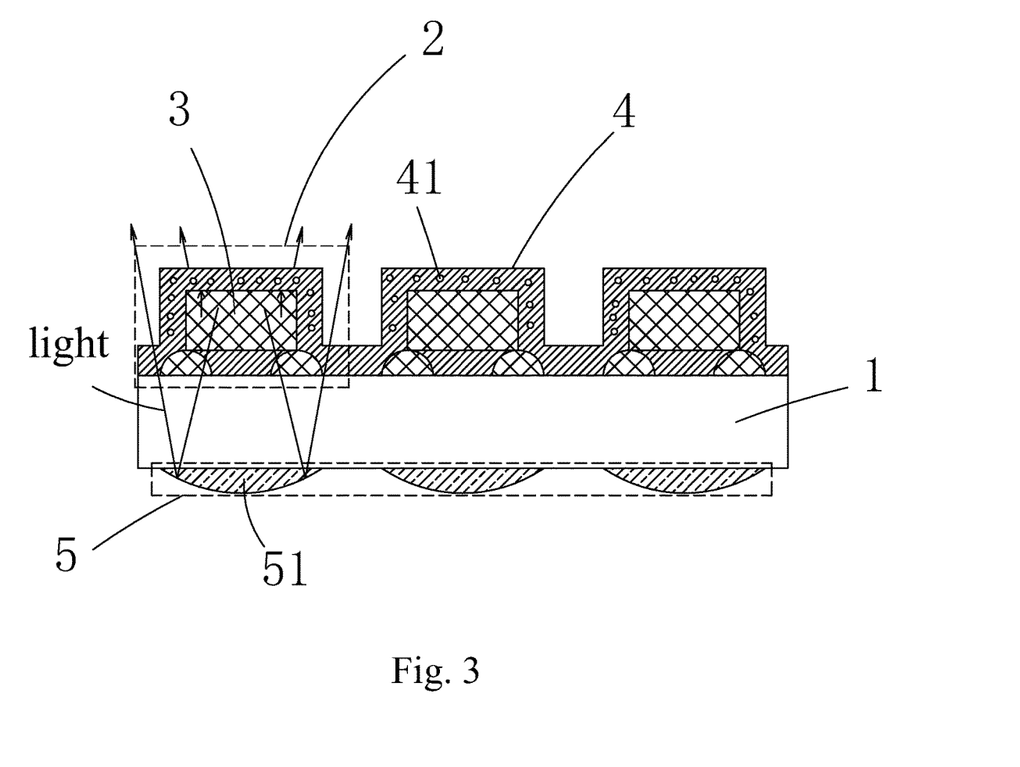
FIG. 3 is a schematic view showing the micro LED display panel provided by a second embodiment of the present invention.
Figure 4:
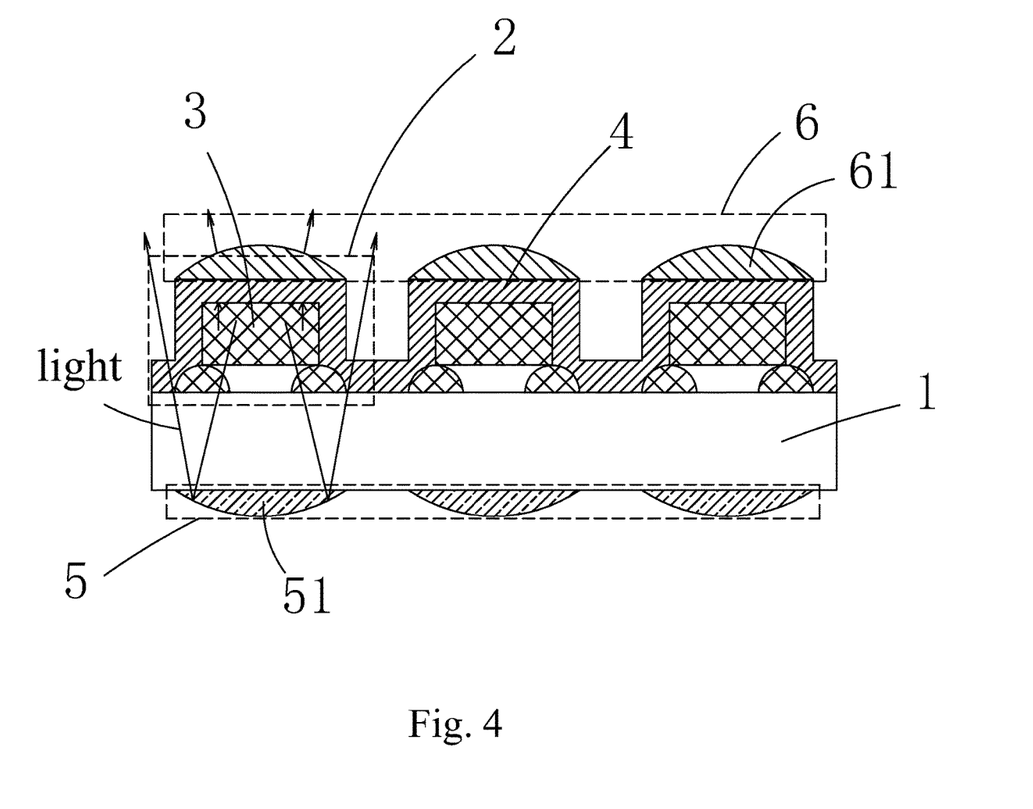
FIG. 4 is a schematic view showing the micro LED display panel provided by a third embodiment of the present invention.
Figure 5:
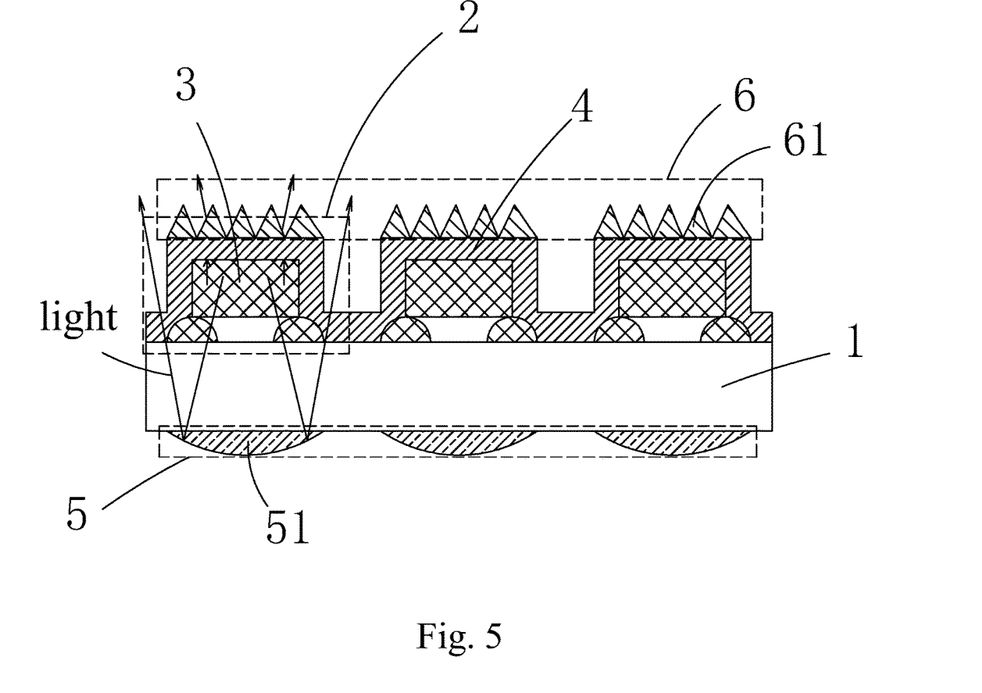
FIG. 5 is a schematic view showing the micro LED display panel provided by a fourth embodiment of the present invention.

Specifically, to further improve the expansion result for the illuminating area in the sub-pixel area 2, in the second to fourth embodiments of the present invention, a scattering unit is disposed on the micro LED 3. The scattering unit scatters the light emitted by the micro LED 3 and passing through the encapsulation layer 4 towards the peripheral of the micro LED 3 to expand the illuminating area inside the sub-pixel area 2.

Refer to FIG. 3. In the second embodiment, the scattering unit is the scattering particles 41 disposed inside the encapsulation layer 4. The scattering particles 41 scatter the light emitted from the micro LED 3 and passing through the encapsulating layer 4 to expand the illuminating area inside the sub-pixel area 2.

Refer to FIG. 4 and FIG. 5. In the third and fourth embodiments of the present invention, the scattering unit is the scattering lens layer 6 disposed on the encapsulating layer 4. The scattering lens layer 6 scatter the light emitted from the micro LED 3 and passing through the encapsulating layer 4 and the scattering lens layer 6. The scattering lens layer 6 comprises a plurality of scattering lens units 61, and the scattering lens units 61 form a one-on-one correspondence with the micro LEDs 3. In other words, the scattering lens unit 61 is disposed on the encapsulating layer 4 above each micro LED 3. The shape of the scattering lens unit 61 can vary according to application. For example, in the third embodiment, the scattering lens unit 61 has a shape of convex surface facing away from the substrate 1; while in the fourth embodiment, the scattering lens unit 61 has a serrated shape.

In summary, the present invention provides a micro LED display panel, with sub-pixel area disposed with a micro LED of a size smaller than the size of the sub-pixel area, and using a reflective lens layer disposed below the micro LED to reflect the light emitted by micro LED to the area surrounding the micro LED inside the sub-pixel area, and thereby expanding the illuminating area inside the sub-pixel area to enhance the display quality and reduce cost.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A micro light-emitting diode (LED) display panel, which comprises: a transparent substrate, and a plurality of sub-pixel areas disposed on an upper surface of the substrate and arranged in an array; a micro LED disposed in each sub-pixel area on the substrate, a transparent encapsulating layer disposed to cover the plurality of micro LEDs, and a reflective lens layer disposed on a lower surface of the substrate;

each sub-pixel area being disposed with a micro LED, and the size of the micro LED being smaller than the size of the sub-pixel area;

the reflective lens layer reflecting the light emitted by the micro LED to the area surrounding the micro LED inside the sub-pixel area to expand the illuminating area inside the sub-pixel area from an unexpanded area to an expanded area that is greater than the unexpanded area, the expanded area being of a predetermined ratio with respect to the unexpanded area, the expanded area being on a plane that is spaced from the micro LED by a distance in the range of $10^{-5}$ times the predetermined ratio and $10^{-2}$ times the predetermined ratio to provide light intensity in the expanded area being greater than one half of a total light intensity from the micro LED.

2. The micro LED display panel as claimed in claim 1, wherein the reflective lens layer comprises a plurality of reflective lens unit, and the reflective lens units form a one-on-one correspondence with the micro LEDs.

3. The micro LED display panel as claimed in claim 2, wherein the reflective lens unit has a shape of convex surface facing away from the substrate.

4. The micro LED display panel as claimed in claim 1, wherein the encapsulating layer further comprises scattering particles, and the scattering particles scatter the light emitted from the micro LED and passing through the encapsulating layer.

5. The micro LED display panel as claimed in claim 1, wherein the encapsulating layer is further disposed with a scattering lens layer, and the scattering lens layer scatter the light emitted from the micro LED and passing through the encapsulating layer and the scattering lens layer.

6. The micro LED display panel as claimed in claim 5, wherein the scattering lens layer comprises a plurality of scattering lens units, and the scattering lens units form a one-on-one correspondence with the micro LEDs.

7. The micro LED display panel as claimed in claim 6, wherein the scattering lens unit has a shape of convex surface facing away from the substrate.

8. The micro LED display panel as claimed in claim 6, wherein the scattering lens unit has a serrated shape.

9. The micro LED display panel as claimed in claim 1, wherein the plurality of micro LEDs comprises: red micro LEDs, green micro LEDs, and blue micro LEDs.

10. The micro LED display panel as claimed in claim 1, wherein the encapsulating layer is made of parylene or organic resin.

11. A micro light-emitting diode (LED) display panel, which comprises: a transparent substrate, and a plurality of sub-pixel areas disposed on an upper surface of the substrate and arranged in an array; a micro LED disposed in each sub-pixel area on the substrate, a transparent encapsulating layer disposed to cover the plurality of micro LEDs, and a reflective lens layer disposed on a lower surface of the substrate;

each sub-pixel area being disposed with a micro LED, and the size of the micro LED being smaller than the size of the sub-pixel area;

the reflective lens layer reflecting the light emitted by the micro LED to the area surrounding the micro LED inside the sub-pixel area to expand the illuminating area inside the sub-pixel area from an unexpanded area to an expanded area that is greater than the unexpanded area, the expanded area being of a predetermined ratio with respect to the unexpanded area, the expanded area being on a plane that is spaced from the micro LED by a distance in the range of $10^{-5}$ times the predetermined ratio and $10^{-2}$ times the predetermined ratio to provide light intensity in the expanded area being greater than one half of a total light intensity from the micro LED;

wherein the reflective lens layer comprising a plurality of reflective lens unit, and the reflective lens units forming a one-on-one correspondence with the micro LEDs;

wherein the plurality of micro LEDs comprising: red micro LEDs, green micro LEDs, and blue micro LEDs;

wherein the encapsulating layer being made of parylene or organic resin.

12. The micro LED display panel as claimed in claim 11, wherein the reflective lens unit has a shape of convex surface facing away from the substrate.

13. The micro LED display panel as claimed in claim 11, wherein the encapsulating layer further comprises scattering particles, and the scattering particles scatter the light emitted from the micro LED and passing through the encapsulating layer.

14. The micro LED display panel as claimed in claim 11, wherein the encapsulating layer is further disposed with a scattering lens layer, and the scattering lens layer scatter the light emitted from the micro LED and passing through the encapsulating layer and the scattering lens layer.

15. The micro LED display panel as claimed in claim 14, wherein the scattering lens layer comprises a plurality of scattering lens units, and the scattering lens units form a one-on-one correspondence with the micro LEDs.

16. The micro LED display panel as claimed in claim 15, wherein the scattering lens unit has a shape of convex surface facing away from the substrate.

17. The micro LED display panel as claimed in claim 15, wherein the scattering lens unit has a serrated shape.

* * * * *